United States Patent
Shu et al.

(10) Patent No.: US 10,466,329 B2
(45) Date of Patent: Nov. 5, 2019

(54) PARTIAL FOURIER ACQUISITION AND RECONSTRUCTION FOR K-SPACE SHELLS BASED MAGNETIC RESONANCE IMAGING

(71) Applicant: Mayo Foundation for Medical Education and Research, Rochester, MN (US)

(72) Inventors: Yunhong Shu, Rochester, MN (US); Matthew A. Bernstein, Rochester, MN (US); Shengzhen Tao, Rochester, MN (US); Joshua D. Trzasko, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 26 days.

(21) Appl. No.: 15/947,046

(22) Filed: Apr. 6, 2018

(65) Prior Publication Data
US 2018/0292498 A1    Oct. 11, 2018

Related U.S. Application Data

(60) Provisional application No. 62/482,273, filed on Apr. 6, 2017.

(51) Int. Cl.
| | | |
|---|---|---|
| *G01R 33/561* | (2006.01) |
| *G01R 33/46* | (2006.01) |
| *G01R 33/385* | (2006.01) |
| *G01R 33/483* | (2006.01) |
| *G01R 33/54* | (2006.01) |
| *G01R 33/48* | (2006.01) |

(52) U.S. Cl.
CPC ....... *G01R 33/5612* (2013.01); *G01R 33/385* (2013.01); *G01R 33/4633* (2013.01); *G01R 33/4826* (2013.01); *G01R 33/4831* (2013.01); *G01R 33/543* (2013.01); *G01R 33/4818* (2013.01); *G01R 33/561* (2013.01)

(58) Field of Classification Search
CPC .............. G01R 33/5612; G01R 33/385; G01R 33/4633; G01R 33/4826; G01R 33/4831; G01R 33/543; G01R 33/4818; G01R 33/561

See application file for complete search history.

(56) References Cited

U.S. PATENT DOCUMENTS

| | | | | |
|---|---|---|---|---|
| 5,532,595 A  * | 7/1996 | Lampman | ............ | G01R 33/446 324/307 |
| 7,245,124 B2 * | 7/2007 | Shu | ........................ | G01R 33/54 324/307 |
| 7,277,597 B2 | 10/2007 | Lee | | |
| 8,214,013 B2 | 7/2012 | Shu | | |

(Continued)

OTHER PUBLICATIONS

Shu Y, et al., Contrast-enhanced intracranial magnetic resonance angiography with a spherical shells trajectory and online gridding reconstruction. J Magn Reson Med 2009;30:1101-1109.

(Continued)

*Primary Examiner* — Gregory H Curran
(74) *Attorney, Agent, or Firm* — Quarles & Brady LLP

(57) ABSTRACT

An asymmetric 3D shells k-space trajectory design with partial Fourier acceleration is described. A non-iterative homodyne reconstruction framework is also described.

23 Claims, 5 Drawing Sheets

(56) References Cited

U.S. PATENT DOCUMENTS 10,302,731 B2 * 5/2019 Trzasko .......... G01R 33/56572

OTHER PUBLICATIONS

Zahneisen B, et al., Single shot concentric shells trajectories for ultra fast fMRI. Magn Reson Med 2012; 68:484-494.

Shu Y, et al., Magnetization-prepared shells trajectory with automated gradient waveform design. Med Physics 2016;43:WE-FG-206-1.

Mugler JP 3rd, et al., Three-dimensional magnetization-prepared rapid gradient-echo imaging (3D MP RAGE). Magn Reson Med 1990;15:152-157.

Noll DC, et al., Homodyne detection in magnetic resonance imaging. IEEE Trans Med Imaging 1991;10:154-163.

Block KT, et al., Spiral imaging: a critical appraisal. J Magn Reson Imaging 2005;21:657-668.

Moriguchi H, et al., Partial Fourier spiral reconstruction under consideration of offresonance effects. In Proceedings of the 12th Annual Meeting of the ISMRM, Kyoto, Japan, 2004. p. 346.

Lustig M, et al., A fast method for designing time-optimal gradient waveforms for arbitrary k-space trajectories. IEEE Trans Med Imaging 2008;27(6):866-873.

Shu Y, et al., Three-dimensional MRI with an undersampled spherical shells trajectory. Magn Reson Med 2006;56:553-562.

Fessler JA, et al., Nonuniform fast Fourier transforms using minmax interpolation. IEEE Trans Signal Process 2003;51:560-574.

Beatty PJ, et al., Rapid gridding reconstruction with a minimal oversampling ratio. IEEE Trans Med Imaging 2005;24:799-808.

Pipe JG, et al., Sampling density compensation in MRI: rationale and an iterative numerical solution. Magn Reson Med 1999;41:179-186.

Tao S, et al., NonCartesian MR image reconstruction with integrated gradient nonlinearity correction. Med Phys 2015;42:7190-7201.

* cited by examiner

US 10,466,329 B2

PARTIAL FOURIER ACQUISITION AND RECONSTRUCTION FOR K-SPACE SHELLS BASED MAGNETIC RESONANCE IMAGING

CROSS-REFERENCE TO RELATED APPLICATIONS

This application claims the benefit of U.S. Provisional Patent Application Ser. No. 62/482,273, filed on Apr. 6, 2017, and entitled "PARTIAL FOURIER ACQUISITION AND RECONSTRUCTION FOR K-SPACE SHELLS BASED MAGNETIC RESONANCE IMAGING," which is herein incorporated by reference in its entirety.

BACKGROUND

The 3D shells k-space trajectory using in magnetic resonance imaging ("MRI") divides k-space into a series of concentric shells and samples each one using 3D helical readouts. With the shells trajectory, the inner k-space, which determines the image contrast, can be efficiently sampled within several interleaves, making it a maximally centric 3D acquisition. The acquisition of inner shells can be synchronized with the time when a certain desired image contrast is expected, such as the contrast agent arrival time in gadolinium-enhanced magnetic resonance angiography, or when the peak of white-to-gray-matter contrast is achieved after a magnetization preparation ("MP") radio frequency ("RF") pulse.

Partial Fourier ("PF") homodyne acquisition is a commonly-used acceleration technique in Cartesian MRI that exploits the conjugate symmetry of k-space measurements. However, unlike Cartesian MRI, utilizing homodyne acquisition in non-Cartesian acquisitions is not straightforward, since directly applying homodyne acquisitions in a direction sampled with a non-Cartesian trajectory does not always yield a physically-achievable trajectory (e.g., 2D spiral), or an iterative reconstruction may be required.

SUMMARY OF THE DISCLOSURE

The present disclosure addresses the aforementioned drawbacks by providing a method for controlling a magnetic resonance imaging ("MRI") system to generate magnetic field gradients to spatially encode spins in a three-dimensional volume-of-interest, which may be a spherical volume-of-interest. Gradient waveforms that define a three-dimensional shells k-space trajectory are generated by a computer system and provided to an MRI system for use. The gradient waveforms are generated by selecting gradient amplitudes and gradient slew rates; selecting a partial Fourier factor; selecting a parameter that controls a rotational speed of the three-dimensional shells k-space trajectory in an azimuthal direction; calculating a number of interleaves for each shell in the three-dimensional shell k-space trajectory; and generating the gradient waveforms based on these parameters. The generated gradient waveforms are then used to generate magnetic field gradients with the MRI system in order to spatially encode spins in a three-dimensional volume-of-interest.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Described here is an asymmetric 3D shells k-space trajectory design with partial Fourier acceleration, as well as a non-iterative homodyne reconstruction framework, for use in magnetic resonance imaging ("MRI"). In general, the 3D shells trajectory-based MRI acquisition is a non-Cartesian acquisition technique that divides the 3D k-space into a series of concentric shells and samples each one with 3D helical readouts. Using these shells trajectories, the inner k-space can be efficiently sampled within several interleaves, making it a maximally centric 3D acquisition. As a result, the functioning of the MRI system can be improved by providing for more efficient acquisition of k-space data using the k-space trajectory described in the present disclosure. This type of data acquisition scheme can advantageously improve contrast-enhanced imaging with the MRI system, because the improved efficiency of acquiring inner shells can be synchronized with the time when a certain desired image contrast is expected, such as the contrast agent arrival time in gadolinium-enhanced magnetic resonance angiography, or when the peak of white-to-gray-matter contrast is achieved after a magnetization preparation ("MP") radio frequency ("RF") pulse.

Figure 1:
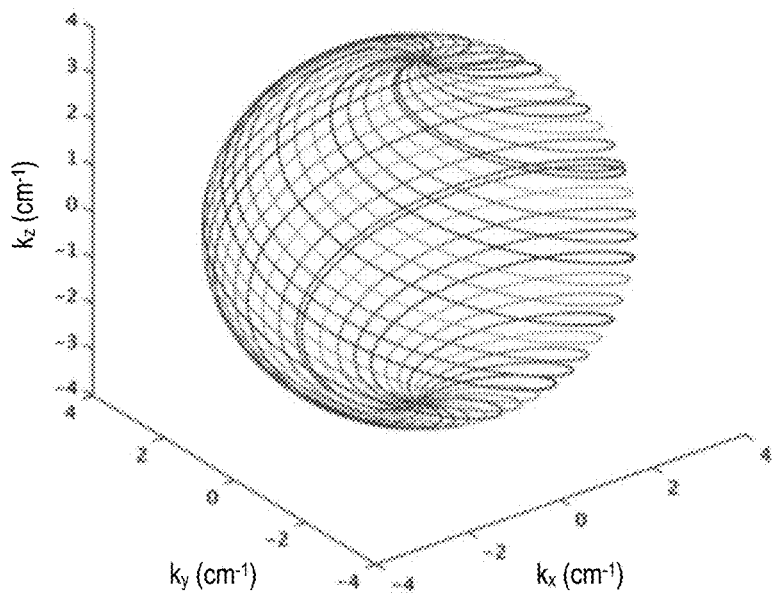
FIG. 1 illustrates an example of a fully sampled three-dimensional shell k-space trajectory.

An example of a 3D shells k-space trajectory is illustrated in FIG. 1. This shells trajectory fully samples k-space. The methods described in the present disclosure utilize partial Fourier acquisition and an asymmetric 3D shells k-space trajectory design to accelerate 3D shells data acquisition. An example of such a k-space trajectory is illustrated in FIG. 2, where the 3D shells k-space trajectory is designed with a partial Fourier factor of 0.7.

Figure 2:
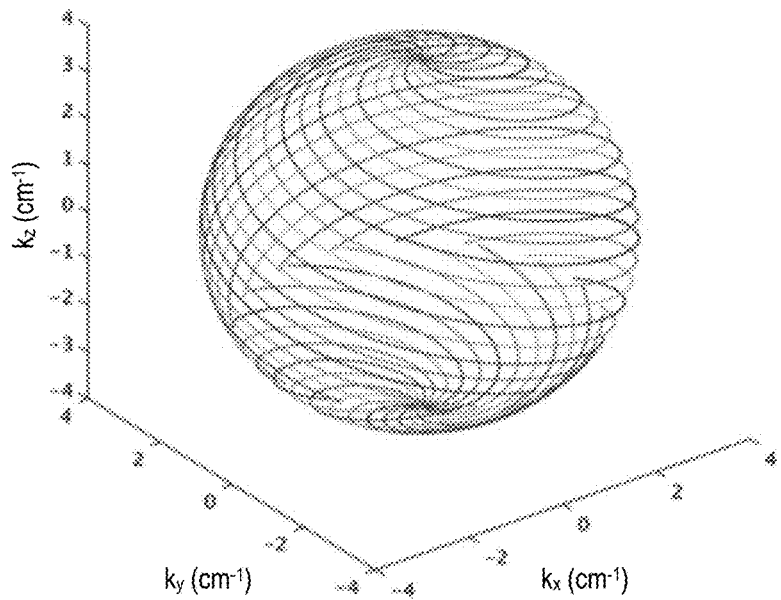
FIG. 2 illustrates an example of an asymmetrical three-dimensional shell k-space trajectory with partial Fourier acceleration, in accordance with the present disclosure.
Figure 3A:
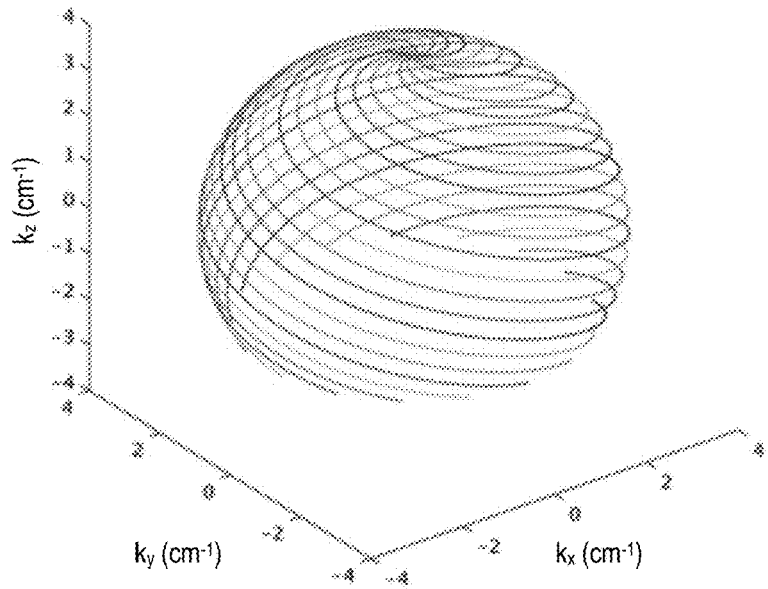
FIG. 3A illustrates a part of the k-space trajectory of FIG. 2 along which k-space data are sampled.
Figure 3B:
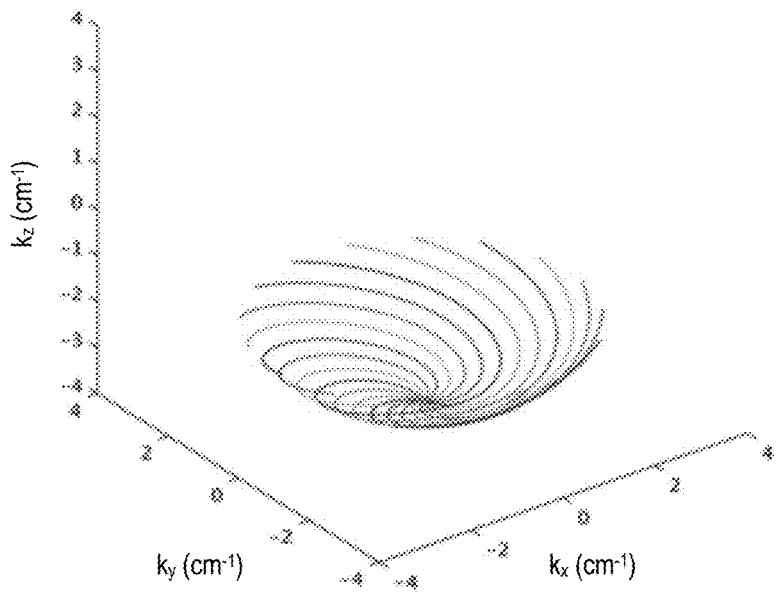
FIG. 3B illustrates a part of the k-space trajectory of FIG. 2 along which k-space data are not sampled.

The k-space trajectory shown in FIG. 2 can include a first part that is sampled and a second part that is not sampled. An example of this is shown in FIGS. 3A and 3B, where FIG. 3A shows the sampled part of k-space using the k-space trajectory shown in FIG. 2, and FIG. 3B shows the unsampled part of k-space due to partial Fourier acceleration, but assumed in reconstruction. In order to enable non-iterative homodyne reconstruction, the unsampled part of the k-space trajectory shown in FIG. 3B is designed to be conjugate symmetric with respect to the corresponding part in shown in FIG. 3A.

Figure 4:
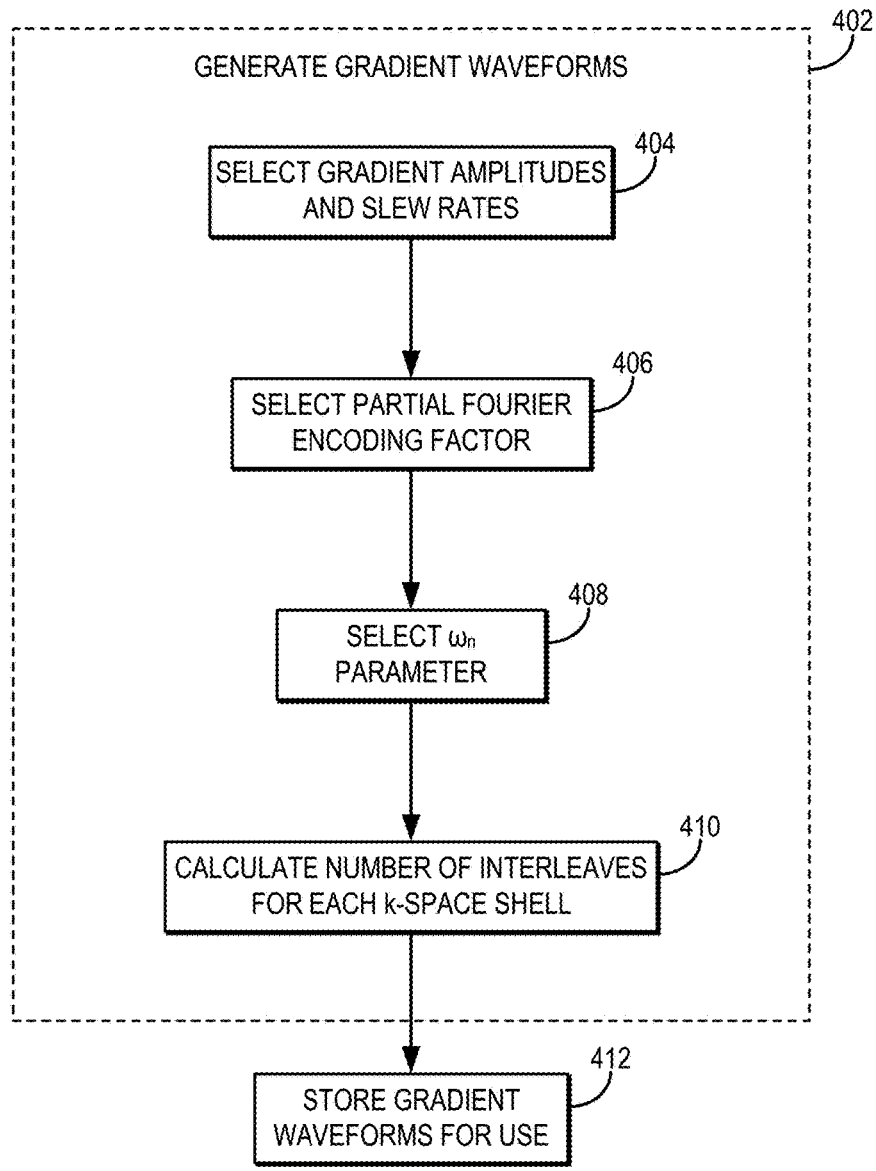
FIG. 4 is a flowchart setting forth the steps of an example method for generating gradient waveforms that define an asymmetrical three-dimensional shell k-space trajectory with partial Fourier acceleration.

Referring now to FIG. 4, an example process for designing such 3D shells k-space trajectories is now described. The 3D k-space shells with a radius, $$k_r(n) = n\Delta k_r \qquad (1);$$

can be sampled using a series of 3D helical readouts expressed as, $$k_z = k_r(n)\cos\left(\frac{\pi\tau}{T}\right); \qquad (2)$$

$$k_x = k_r(n)\sin\left(\frac{\pi\tau}{T}\right)\cos\left(\frac{\omega_n\tau}{T} + \theta_{n,m}\right); \qquad (3)$$

$$k_y = k_r(n)\sin\left(\frac{\pi\tau}{T}\right)\cos\left(\frac{\omega_n\tau}{T} + \theta_{n,m}\right); \qquad (4)$$

where T is the total number of samples per readout, $\tau$ indexes each readout sample, $\theta_{n,m} = 2\,m\pi/M\,(n)$ is the initial phase of a interleave, M (n) is the total interleave number, m≤M indexes different interleaves, and $\omega_n$ controls the rotational speed in the k-space azimuthal direction.

For a fully-sampled shells acquisition, $\tau \leq T$, and the trajectory samples the entire shell along the z-direction (i.e., from $k_z = N\Delta k_r$ to $k_z = -N\Delta k_r$). To achieve partial Fourier acceleration, $\tau$ can be modified as, $$\tau = \frac{T}{\pi}\cos^{-1}\left(\frac{(1-2\kappa)N}{n}\right); \qquad (5)$$

so that the trajectory only samples from $k_z = N\Delta k_r$ to $k_z = (1-2\kappa)\,N\Delta k_r$, where $\kappa$ denotes the partial Fourier factor. Thus, generating the gradient waveforms as descried below can include selecting the $\tau$ parameter and the partial Fourier factor. As one example, the partial Fourier factor can be selected from the range $0.5 < \kappa < 1$.

For any selected partial Fourier factor and $\tau$, the gradient waveforms of each readout/interleave are generated, as indicated at step 402. As one example, these gradient waveforms can be generated via a time-optimal waveform design strategy, such as the design strategy described by M. Lustig, et al., in "A Fast Method for Designing Time-Optimal Gradient Waveforms for Arbitrary k-Space Trajectories," *IEEE Trans Med Imaging*, 2008; 27(6):866-873. As part of generating the gradient waveforms, partial Fourier factor and $\tau$ ($\kappa$) are selected, as indicated at step 404, and as described above. The gradient amplitude and slew rate limits are also selected, as indicated at step 406. In general, the gradient amplitude and slew rates are chosen to conform to both hardware limits and Nyquist sampling requirements. As another part of generating the gradient waveforms, the $\omega_n$ parameter is selected, as indicated at step 408. In a non-limiting example, the $\omega_n$ parameter can be iteratively determined so that each readout contains T samples. The $\omega_n$ parameter may also be selected or calculated based, at least in part, on the selected partial Fourier factor. The number of interleaves for each shell, M, is then calculated, as indicated at step 410. As an example, the number of interleaves for each shell, M, can be calculated by constraining the maximal k-space distance (i.e., on the equator of each shell) between two adjacent interleaves to satisfy the Nyquist requirement, which yields, $$M = 2\pi n \cdot \sin\left(\tan^{-1}\left(\frac{\pi}{\omega_n}\right)\right). \qquad (6)$$

The completed gradient waveforms can then be stored for later use, as indicated at step 412. For example, the gradient waveforms can be stored in a data storage where they can later be retrieved by an MRI system during an imaging scan, or can be sent directly to the MRI system and stored in a memory for use by the MRI system.

It will be appreciated by persons having ordinary skill in the art that auxiliary accelerations can also be implemented with the 3D shells trajectories described in the present disclosure. For instance, parallel imaging-based interleave skipping could also be implemented to provide additional accelerations.

Figure 5:
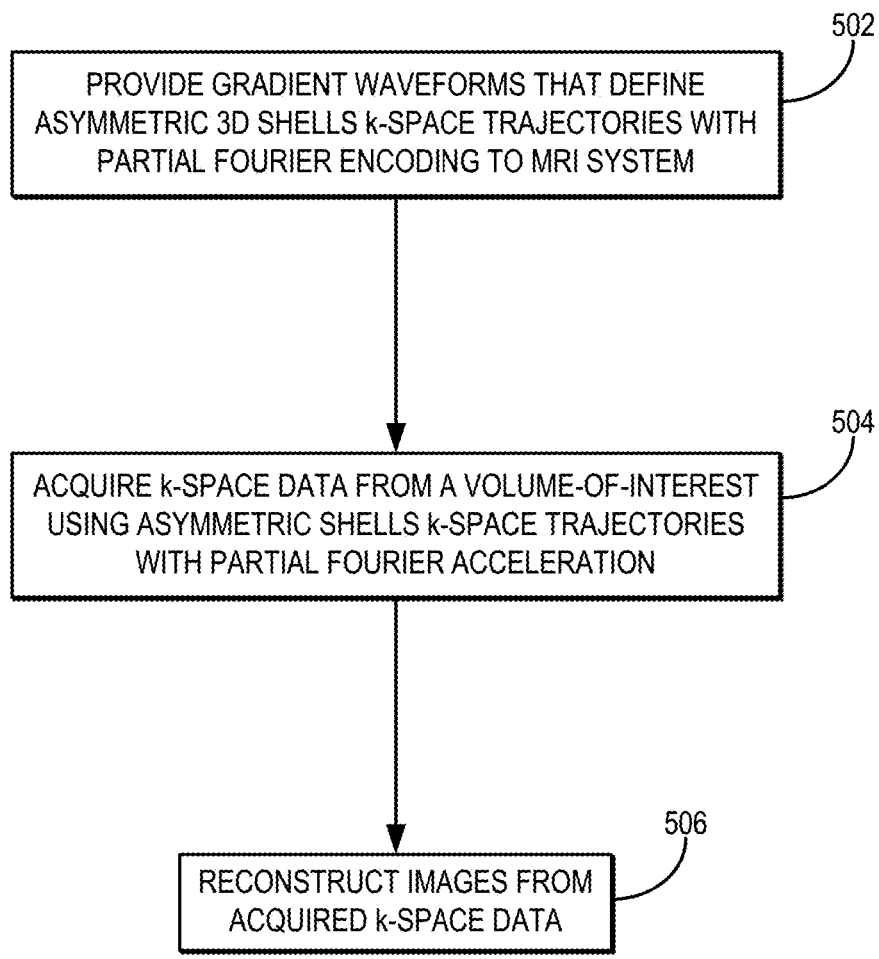
FIG. 5 is a flowchart setting forth the steps of an example method for imaging a subject using an asymmetrical three-dimensional shell k-space trajectory with partial Fourier acceleration.

Referring now to FIG. 5, a flowchart is illustrated as setting forth the steps of an example method for imaging a subject with an MRI system using asymmetric 3D shells k-space trajectories with partial Fourier acceleration. The method includes providing gradient waveforms to the MRI system, as indicated at step 502, where those gradient waveforms define asymmetric 3D shells k-space trajectories with partial Fourier acceleration. These gradient waveforms can be provided to the MRI system by retrieving previously computed gradient waveforms from a data storage, or by generating the gradient waveforms on-line and communicating the gradient waveforms to the MRI system.

Data are then acquired from a volume-of-interest using, in part, the gradient waveforms that define the 3D shells k-space trajectories, as indicated at step 504. For instance, data are acquired using a pulse sequence that use the gradient waveforms that define the 3D shells k-space trajectories for readout gradients, such that k-space data are sampled along the 3D shells k-space trajectories. As described above, in some implementations, data are acquired by sampling k-space along only part of the 3D shells k-space trajectories. Images of the volume-of-interest are then reconstructed from the acquired data, as indicated at step 506. These images can be reconstructed using any suitable iterative reconstruction technique, but can advantageously be reconstructed using a non-iterative technique because of the k-space trajectory design.

For the non-iterative reconstruction, the following process is implemented. The real-valued image vector, $u_r$, can be reconstructed from the measured k-space data, g, using a non-iterative gridding-type reconstruction, such as the following:

$$u_r \sim \text{real}\{\Phi^* A^* D(\Psi_L + 2\Psi_H)g\} \qquad (7);$$

where A is the forward-encoding operator including off-resonance effects (presumed known from separate dual-echo prescan), and A* is its adjoint. In some embodiments, the forward-encoding operator including off-resonance effects can be estimated from a separate prescan, such as a dual-echo prescan. The forward operator can also incorporate other corrections, such as corrections for gradient delays and other non-idealities other than off-resonance. The matrix D is a sampling density compensation function. In some embodiments, this function can be determined for the k-space shells trajectory using the algorithm described by J. Pipe and P. Menon in "Sampling Density Compensation in MRI: Rationale and an Iterative Numerical Solution," *Magn Reson Med*, 1999; 41:179-186. The matrices $\Psi_L$ and $\Psi_H$ are binary diagonal matrices extracting the low-pass and high-pass regions of k-space, respectively, along the partial Fourier acceleration direction (i.e., the z-direction). The matrix $\Phi$ is a diagonal matrix that approximates the residual spatial phase signal (e.g., from eddy-currents, $B_1^-$ fields) that is not considered within A. This residual spatial phase signal can be estimated from the fully-sampled (e.g., z-direction), low-pass k-space data. Eqn. (7) is applicable to a k-space shells trajectory because one k-space hemisphere is fully sampled, based on the design described in the present disclosure.

Examples of iterative reconstruction techniques that can be implemented include iterative partial Fourier reconstruction techniques such as projections onto convex sets ("POCS"). Other reconstruction techniques can also be implemented, including parallel imaging reconstructions such as SENSE, GRAPPA, or compressed sensing-based reconstructions. In these instances, the iterative reconstruction algorithm can include optimizing an objective function that incorporates one or more different types of information. As one example, the objective function can include a forward operator that includes information about off-resonance effects, which can be estimated from a separate prescan, such as a dual-echo prescan. The forward operator can also incorporate other corrections, such as corrections for gradient delays and other non-idealities other than off-resonance, such as subject-specific or system-specific non-idealities. The objective function can also incorporate other a priori information, such as phased array receiver sensitives or image structure of the reconstructed image, such as sparsity.

Comparing with the fully-sampled 3D shells k-space trajectory, the k-space trajectories described in the present disclosure preserve image resolution while reducing acquisition time. Thus, a 3D shell k-space trajectory with partial Fourier acceleration has been described, as well as a non-iterative homodyne reconstruction for such trajectories. This trajectory inherits the high k-space sampling efficiency from fully-sampled shells trajectory, but reduces acquisition time or sensitivity to off-resonance. Although the methods described above describe using the 3D shells k-space trajectories for imaging applications, it will be appreciated by those skilled in the art that the 3D shells k-space trajectories described here can also be used as navigators for acquiring navigator signals that can be used for motion correction and the like.

Figure 6:
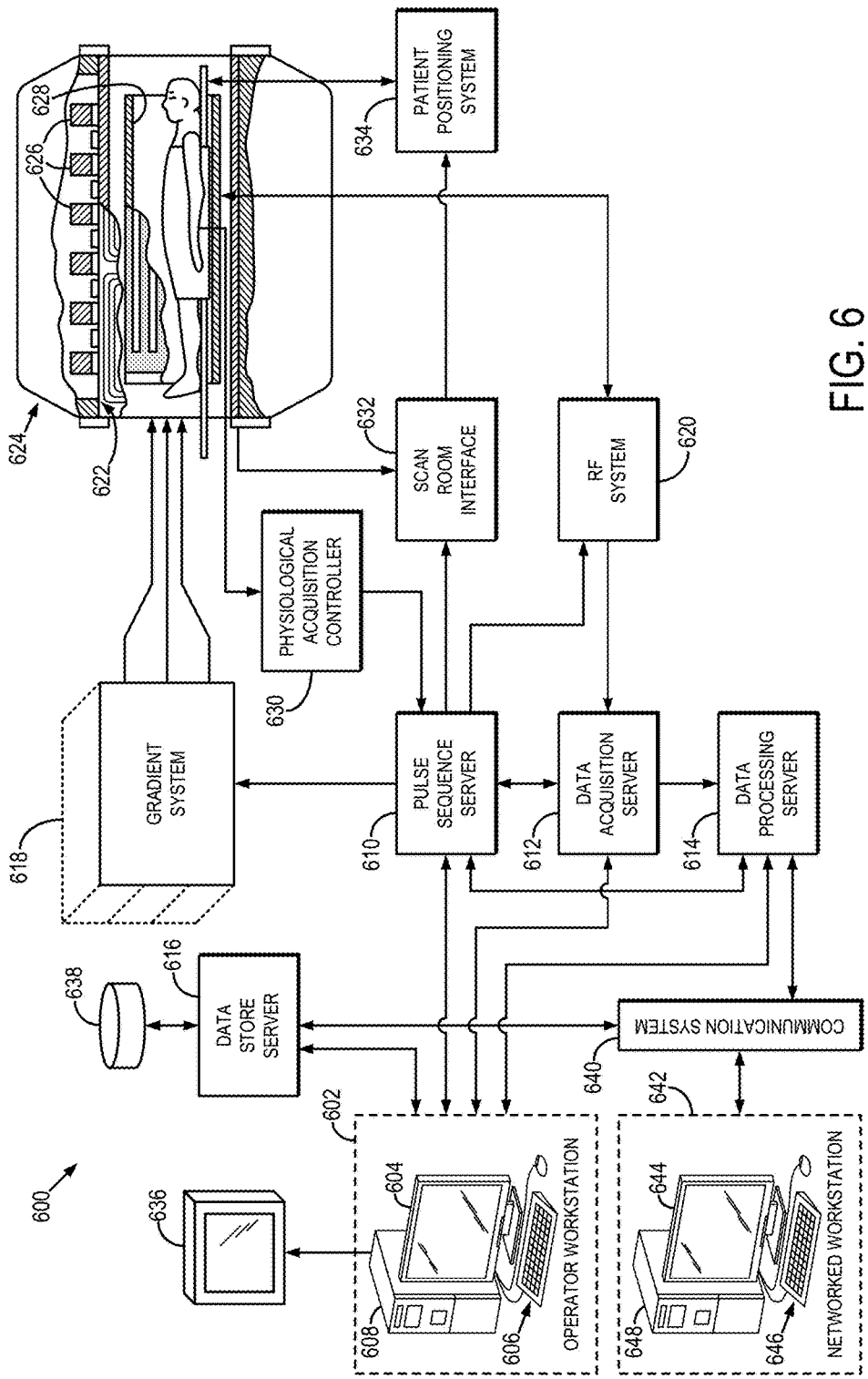
FIG. 6 is a block diagram of an example magnetic resonance imaging ("MRI") system that can implement the methods described in the present disclosure.

Referring particularly now to FIG. 6, an example of an MRI system 600 that can implement the methods described here is illustrated. The MRI system 600 includes an operator workstation 602 that may include a display 604, one or more input devices 606 (e.g., a keyboard, a mouse), and a processor 608. The processor 608 may include a commercially available programmable machine running a commercially available operating system. The operator workstation 602 provides an operator interface that facilitates entering scan parameters into the MRI system 600. The operator workstation 602 may be coupled to different servers, including, for example, a pulse sequence server 610, a data acquisition server 612, a data processing server 614, and a data store server 616. The operator workstation 602 and the servers 610, 612, 614, and 616 may be connected via a communication system 640, which may include wired or wireless network connections.

The pulse sequence server 610 functions in response to instructions provided by the operator workstation 602 to operate a gradient system 618 and a radiofrequency ("RF") system 620. Gradient waveforms for performing a prescribed scan are produced and applied to the gradient system 618, which then excites gradient coils in an assembly 622 to produce the magnetic field gradients $G_x$, $G_y$, and $G_z$ that are used for spatially encoding magnetic resonance signals. The gradient coil assembly 622 forms part of a magnet assembly 624 that includes a polarizing magnet 626 and a whole-body RF coil 628.

RF waveforms are applied by the RF system 620 to the RF coil 628, or a separate local coil to perform the prescribed magnetic resonance pulse sequence. Responsive magnetic resonance signals detected by the RF coil 628, or a separate local coil, are received by the RF system 620. The responsive magnetic resonance signals may be amplified, demodulated, filtered, and digitized under direction of commands produced by the pulse sequence server 610. The RF system 620 includes an RF transmitter for producing a wide variety of RF pulses used in MRI pulse sequences. The RF transmitter is responsive to the prescribed scan and direction from the pulse sequence server 610 to produce RF pulses of the desired frequency, phase, and pulse amplitude waveform. The generated RF pulses may be applied to the whole-body RF coil 628 or to one or more local coils or coil arrays.

The RF system 620 also includes one or more RF receiver channels. An RF receiver channel includes an RF preamplifier that amplifies the magnetic resonance signal received by the coil 628 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \tag{8}$$

and the phase of the received magnetic resonance signal may also be determined according to the following relationship:

$$\varphi = \tan^{-1}\left(\frac{Q}{I}\right). \tag{9}$$

The pulse sequence server 610 may receive patient data from a physiological acquisition controller 630. By way of example, the physiological acquisition controller 630 may receive signals from a number of different sensors connected to the patient, including electrocardiograph ("ECG") signals from electrodes, or respiratory signals from a respiratory bellows or other respiratory monitoring devices. These signals may be used by the pulse sequence server 610 to synchronize, or "gate," the performance of the scan with the subject's heart beat or respiration.

The pulse sequence server 610 may also connect to a scan room interface circuit 632 that receives signals from various sensors associated with the condition of the patient and the magnet system. Through the scan room interface circuit 632, a patient positioning system 634 can receive commands to move the patient to desired positions during the scan.

The digitized magnetic resonance signal samples produced by the RF system 620 are received by the data acquisition server 612. The data acquisition server 612 operates in response to instructions downloaded from the operator workstation 602 to receive the real-time magnetic resonance data and provide buffer storage, so that data is not lost by data overrun. In some scans, the data acquisition server 612 passes the acquired magnetic resonance data to the data processor server 614. In scans that require information derived from acquired magnetic resonance data to control the further performance of the scan, the data acquisition server 612 may be programmed to produce such information and convey it to the pulse sequence server 610. For example, during pre-scans, magnetic resonance data may be acquired and used to calibrate the pulse sequence performed by the pulse sequence server 610. As another example, navigator signals may be acquired and used to adjust the operating parameters of the RF system 620 or the gradient system 618, or to control the view order in which k-space is sampled. In still another example, the data acquisition server 612 may also process magnetic resonance signals used to detect the arrival of a contrast agent in a magnetic resonance angiography ("MRA") scan. For example, the data acquisition server 612 may acquire magnetic resonance data and processes it in real-time to produce information that is used to control the scan.

The data processing server 614 receives magnetic resonance data from the data acquisition server 612 and processes the magnetic resonance data in accordance with instructions provided by the operator workstation 602. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 614 are conveyed back to the operator workstation 602 for storage. Real-time images may be stored in a data base memory cache, from which they may be output to operator display 602 or a display 636. Batch mode images or selected real time images may be stored in a host database on disc storage 638. When such images have been reconstructed and transferred to storage, the data processing server 614 may notify the data store server 616 on the operator workstation 602. The operator workstation 602 may be used by an operator to archive the images, produce films, or send the images via a network to other facilities.

The MRI system 600 may also include one or more networked workstations 642. For example, a networked workstation 642 may include a display 644, one or more input devices 646 (e.g., a keyboard, a mouse), and a processor 648. The networked workstation 642 may be located within the same facility as the operator workstation 602, or in a different facility, such as a different healthcare institution or clinic.

The networked workstation 642 may gain remote access to the data processing server 614 or data store server 616 via the communication system 640. Accordingly, multiple networked workstations 642 may have access to the data processing server 614 and the data store server 616. In this manner, magnetic resonance data, reconstructed images, or other data may be exchanged between the data processing server 614 or the data store server 616 and the networked workstations 642, such that the data or images may be remotely processed by a networked workstation 642.

The present disclosure has described one or more preferred embodiments, and it should be appreciated that many equivalents, alternatives, variations, and modifications, aside from those expressly stated, are possible and within the scope of the invention.

The invention claimed is:

1. A method for controlling a magnetic resonance imaging (MRI) system to generate magnetic field gradients to spatially encode spins in a three-dimensional volume-of-interest, the steps of the method comprising:

(a) generating with a computer system, gradient waveforms that define a three-dimensional shell k-space trajectory by:
selecting gradient amplitudes and gradient slew rates;
selecting a partial Fourier factor;
selecting a parameter that controls a rotational speed of the three-dimensional shell k-space trajectory in an azimuthal direction;
calculating a number of interleaves for each shell in the three-dimensional shell k-space trajectory; and
generating the gradient waveforms based on the selected gradient amplitudes and gradient slew rates, the selected parameter that controls the rotational speed of the three-dimensional shell k-space trajectory in the azimuthal direction, the calculated number of interleaves for each shell, and the selected partial Fourier factor;

(b) providing the generated gradient waveforms to an MRI system; and (c) using the generated gradient waveforms, generating magnetic field gradients with the MRI system to spatially encode spins in a three-dimensional volume-of-interest.

2. The method as recited in claim 1, wherein parameter that controls the rotational speed of the three-dimensional shell k-space trajectory in the azimuthal direction is iteratively determined so that each readout contains a selected number of samples.

3. The method as recited in claim 1, wherein the number of interleaves for each shell in the three-dimensional shell k-space trajectory is calculated by constraining a maximal k-space distance between two adjacent interleaves to satisfy a selected criterion.

4. The method as recited in claim 3, wherein the selected criterion is a Nyquist criterion.

5. The method as recited in claim 1, wherein the partial Fourier factor is selected from a range of 0.5 to 1.

6. The method as recited in claim 1, further comprising acquiring k-space data in response to applied radio frequency (RF) energy that is resonant with the spatially encoded spins, and reconstructing an image depicting the volume-of-interest from the acquired k-space data.

7. The method as recited in claim 6, wherein the image is reconstructed from the acquired k-space data using a non-iterative reconstruction algorithm based on, $$u_r \sim \mathrm{real}\{\Phi^* A^* D(\Psi_L + 2\Psi_H)g\}$$

wherein $u_r$ is a real-valued image vector; $A^*$ is an adjoint of a forward-encoding operator; $\Phi^*$ is an adjoint of a diagonal matrix that approximates residual spatial phase signal not considered in $A^*$; $D$ is a sampling density compensation function; $\Psi_L$ and $\Psi_H$ are binary diagonal matrices extracting low-pass and high-pass regions of k-space, respectively, along the azimuthal direction; and $g$ is the acquired k-space data.

8. The method as recited in claim 7, wherein the adjoint of the forward encoding operator includes off-resonance effects.

9. The method as recited in claim 8, wherein the adjoint of the forward encoding operator is estimated from prescan data.

10. The method as recited in claim 7, wherein the adjoint of the forward encoding operator includes corrections for gradient delays.

11. The method as recited in claim 1, wherein the three-dimensional shell k-space trajectory defined by the gradient waveforms includes a first part and a second part, and wherein data are acquired by sampling k-space only along the first part of the three-dimensional shell k-space trajectory.

12. The method as recited in claim 11, wherein the gradient waveforms are selected by the computer system such that the second part of the three-dimensional shell k-space trajectory is conjugate symmetric with respect to the first part of the three-dimensional shell k-space trajectory.

13. The method as recited in claim 1, wherein generating the gradient waveforms with the computer system includes implementing a time-optimal waveform design algorithm to which the selected gradient amplitudes and gradient slew rates, the selected parameter that controls the rotational speed of the three-dimensional shell k-space trajectory in the azimuthal direction, the calculated number of interleaves for each shell, and the selected partial Fourier factor are provided as inputs.

14. The method as recited in claim 1, further comprising acquiring k-space data in response to applied radio frequency (RF) energy that is resonant with the spatially encoded spins, and reconstructing an image depicting the volume-of-interest from the acquired k-space data using an iterative reconstruction algorithm implemented with a hardware processor and a memory.

15. The method as recited in claim 14, wherein the iterative reconstruction algorithm optimizes an objective function that includes a forward operator that incorporates information about at least one of off-resonance effects, gradient delays, subject-specific non-ideality information, or system-specific non-ideality information.

16. The method as recited in claim 14, wherein the k-space data are acquired using a phase array receiver and the iterative reconstruction algorithm optimizes an objective function that incorporates a priori information about sensitivities of coils in the phase array receiver.

17. The method as recited in claim 14, wherein the iterative reconstruction algorithm optimizes an objective function that incorporates a priori information about structure of the reconstructed image.

18. The method as recited in claim 17, wherein the structure of the reconstructed image is a sparsity of the reconstructed image.

19. A magnetic resonance imaging (MRI) system, comprising:

a magnet that generates a polarizing magnetic field about a region-of-interest;

a gradient system comprising at least one gradient coil that applies a gradient field to the polarizing magnetic field in response to gradient waveforms applied by the gradient system;

a radio frequency (RF) system comprising at least one RF coil that generates an RF field in the region-of-interest; and a computer system comprising a processor and a memory, the memory having stored thereon instructions that, when executed by the processor, cause the processor to generate gradient waveforms that when applied to the at least one gradient coil by the gradient system cause the at least one gradient coil to apply a gradient field to the polarizing magnetic field such that the gradient field defines a three-dimensional shell k-space trajectory;

wherein the memory has stored thereon gradient waveform parameters comprising:
  gradient amplitudes;
  gradient slew rates;
  a parameter that controls a rotational speed of the three-dimensional shell k-space trajectory in an azimuthal direction;
  a number of interleaves for each shell; and
  a partial Fourier factor;
wherein the processor generates the gradient waveforms based on the gradient waveform parameters stored on the memory.

20. The MRI system as recited in claim 19, wherein the parameter that controls the rotational speed of the three-dimensional shell k-space trajectory in the azimuthal direction is iteratively determined with the computer system so that each readout contains a selected number of samples.

21. The MRI system as recited in claim 19, wherein the number of interleaves for each shell in the three-dimensional shell k-space trajectory is calculated with the computer system by constraining a maximal k-space distance between two adjacent interleaves to satisfy a selected criterion.

22. The MRI system as recited in claim 21, wherein the selected criterion is a Nyquist criterion.

23. The MRI system as recited in claim 19, wherein the partial Fourier factor stored on the memory is selected from a range of 0.5 to 1.

* * * * *